(12) United States Patent
Suzuki et al.

(10) Patent No.: US 10,141,539 B2
(45) Date of Patent: Nov. 27, 2018

(54) DISPLAY DEVICE

(71) Applicant: Japan Display Inc., Tokyo (JP)

(72) Inventors: Takayasu Suzuki, Tokyo (JP);
Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/964,405

(22) Filed: Apr. 27, 2018

(65) Prior Publication Data

US 2018/0248148 A1  Aug. 30, 2018

Related U.S. Application Data

(63) Continuation of application No. 15/205,142, filed on Jul. 8, 2016, now Pat. No. 10,003,045.

(30) Foreign Application Priority Data

Jul. 10, 2015 (JP) ................. 2015-139217

(51) Int. Cl.
*H01L 51/00* (2006.01)
*H01L 33/00* (2010.01)
*H01L 51/52* (2006.01)
*H01L 27/32* (2006.01)

(52) U.S. Cl.
CPC ...... *H01L 51/5246* (2013.01); *H01L 27/3258* (2013.01); *H01L 51/0024* (2013.01); *H01L 51/525* (2013.01); *H01L 51/5253* (2013.01); *H01L 51/5259* (2013.01)

(58) Field of Classification Search
CPC ............ H01L 51/5259; H01L 27/3258; H01L 51/5253; H01L 51/5246; H01L 51/525; H01L 51/0024

See application file for complete search history.

(56) References Cited

U.S. PATENT DOCUMENTS

| | | | |
|---|---|---|---|
| 8,493,531 B2 | 7/2013 | Shimada et al. | |
| 9,065,021 B2 | 6/2015 | Nagata et al. | |
| 9,448,441 B2 | 9/2016 | Moriwaki | |
| 2005/0046346 A1 | 3/2005 | Tsuchiya et al. | |
| 2014/0014909 A1 | 1/2014 | Lee et al. | |
| 2014/0203260 A1* | 7/2014 | Ookawara | H01L 27/3276 257/40 |

(Continued)

FOREIGN PATENT DOCUMENTS

JP  2008-186681 A  8/2008

*Primary Examiner* — Shouxiang Hu
(74) *Attorney, Agent, or Firm* — Typha IP LLC (57) ABSTRACT

A display device includes: a resin layer on the circuit layer including a groove surrounding and separating a display area; light-emitting elements on an upper surface of the resin layer so as to emit light with luminances controlled by the currents; a sealing layer covering the light-emitting elements; a second substrate above the sealing layer; a sealing material provided between the sealing layer and the second substrate so as to surround the display area and the groove; and a filling layer surrounded by the sealing material between the sealing layer and the second substrate. The groove is formed along a line describing a shape that is inscribed in a rectangle and not in contact with corners of the rectangle as viewed in a direction vertical to the upper surface of the resin layer.

11 Claims, 9 Drawing Sheets (56) References Cited

U.S. PATENT DOCUMENTS

2014/0346484 A1* 11/2014 Nendai ............... H01L 51/5228
  257/40
2015/0060832 A1  3/2015 Ito et al.
2015/0279912 A1 10/2015 Negishi
2016/0020433 A1* 1/2016 Uesugi ................ H01L 51/5228
  438/4

* cited by examiner

DISPLAY DEVICE

CROSS-REFERENCE TO RELATED APPLICATIONAPPLICATIONS

This application is a continuation of U.S. application Ser. No. 15/205,142 filed on Jul. 8, 2016. Further, this application claims priority from Japanese Application JP2015-139217 filed on Jul. 10, 2015, the contents of which are hereby incorporated by reference into this application.

BACKGROUND OF THE INVENTION

1. Field of the Invention

The present invention relates to a display device in which a light-emitting element that is an electroluminescence (EL) element, an organic EL element, or other self-luminous type display element is mounted.

2. Description of the Related Art

In a display device in which a plurality of light-emitting elements represented by organic EL elements or the like are disposed, a display area is covered by a sealing layer configured of a silicon nitride film or the like in order to prevent the degradation of the organic EL elements due to moisture entering the interior of the display device.

JP 2008-186681A, it is described to provide a highly reliable organic EL display device capable of preventing degradation due to the influence of moisture. Especially in FIG. 2, an invention is disclosed in which, by coating a coating-type moisture absorbent in a direction away from a corner portion of the display area, moisture or the like is prevented from entering from the corner portion of the display area. When the coating-type moisture absorbent is coated in the direction away from the corner portion as described above, there is a problem in that a picture-frame area is increased.

Here, even when the light-emitting elements in the display area are protected by the sealing layer, adverse effects due to the entry of moisture may occur.

A path for moisture to the display area protected by the sealing layer is assumed to be formed in a planarizing layer formed of an organic insulating film for planarizing irregularities caused by a circuit layer or in a pixel separation film formed of an organic insulating film for separating the light-emitting elements for each pixel.

SUMMARY OF THE INVENTION

In view of the problems described above, it is an object of the invention to provide a display device in which the entry of moisture into a display area where a plurality of light-emitting elements are disposed is prevented.

A display device according to an aspect of the invention includes: a first substrate; a circuit layer formed on the first substrate so as to include circuits for controlling currents respectively corresponding to a plurality of unit pixels constituting an image; a resin layer provided on the circuit layer and including a groove surrounding and separating a display area; a plurality of light-emitting elements provided on an upper surface of the resin layer so as to emit light with luminances control led by the currents; a sealing layer covering the plurality of light-emitting elements; a second substrate disposed above the sealing layer; a sealing material provided between the sealing layer and the second substrate so as to surround the display area and the groove; and a filling layer surrounded by the sealing material between the sealing layer and the second substrate, wherein the groove is formed along a line describing a shape that is inscribed in a rectangle and not in contact with corners of the rectangle as viewed in a direction vertical to the upper surface of the resin layer.

A display device according to another aspect of the invention includes: a first substrate; a circuit layer formed on the first substrate so as to include circuits for controlling currents respectively corresponding to a plurality of unit pixels constituting an image; a resin layer provided on the circuit layer and including a groove surrounding and separating a display area; a plurality of light-emitting elements provided on an upper surface of the resin layer so as to emit light with luminances controlled by the currents; a sealing layer covering the plurality of light-emitting elements; a second substrate having a planar shape smaller than that of the first substrate and disposed above the sealing layer so as to expose a portion of the first substrate; a sealing material provided between the sealing layer and the second substrate so as to surround the display area and the groove; and a filling layer surrounded by the sealing material between the sealing layer and the second substrate, wherein the planar shape of the second substrate includes corner portions that are inscribed in a rectangle and coincident with or inside corners of the rectangle, and the groove is formed along a line describing a similar figure obtained by reducing a shape that is inscribed in the planar shape of the second substrate and not in contact with the corner portions as viewed in a direction vertical to the upper surface of the resin layer.

DETAILED DESCRIPTION OF THE INVENTION

Hereinafter, an organic EL display device according to each embodiment of the invention will be described with reference to the drawings.

[First Embodiment]

Figure 1:
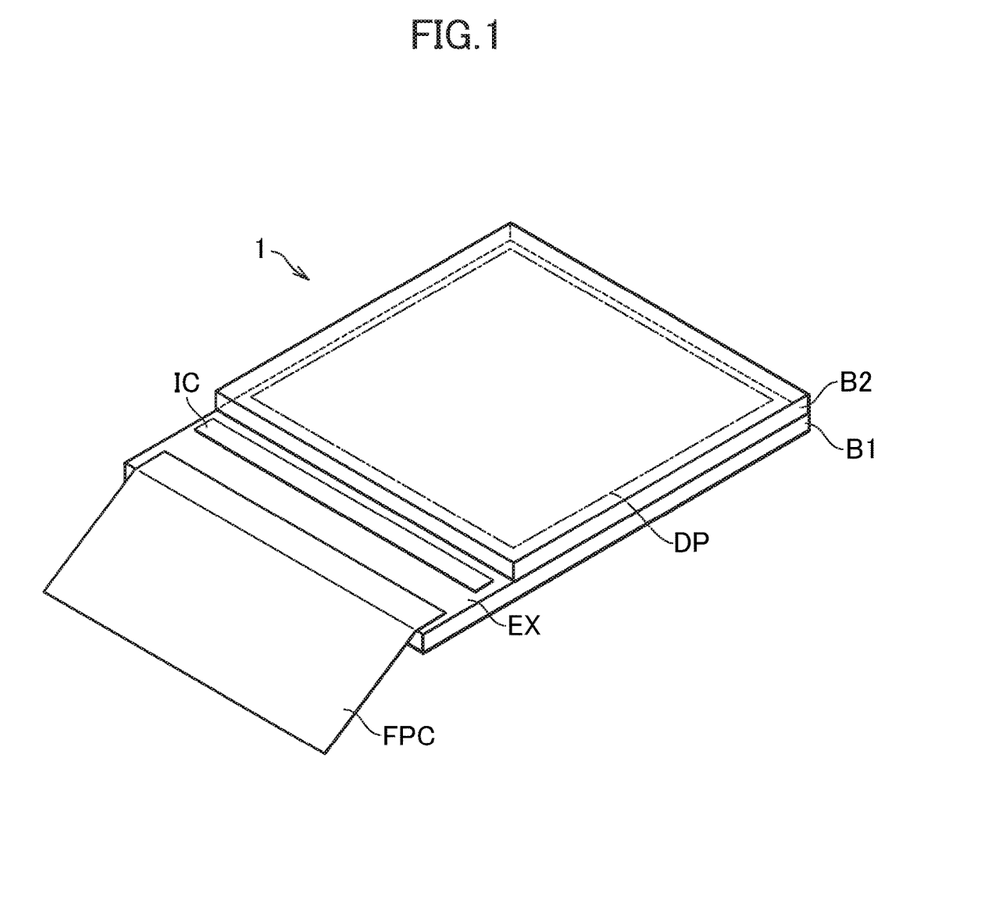
FIG. 1 is a perspective view of an organic EL display device according to a first embodiment.

FIG. 1 is a schematic plan view for explaining an organic EL display device 1 of a first embodiment. The organic EL display device 1 of the embodiment is configured by bonding a second substrate B2 to a first substrate B1 on which organic electroluminescence elements as a plurality of light-emitting elements are disposed. In an area (exposed area EX) of the first substrate B1 exposed from the second substrate B2, a driver semiconductor device IC for driving the organic EL display device 1 is disposed. Further, a flexible printed board FPC is disposed in the vicinity of the edge portion of the exposed area EX of the first substrate B1.

Figure 2:
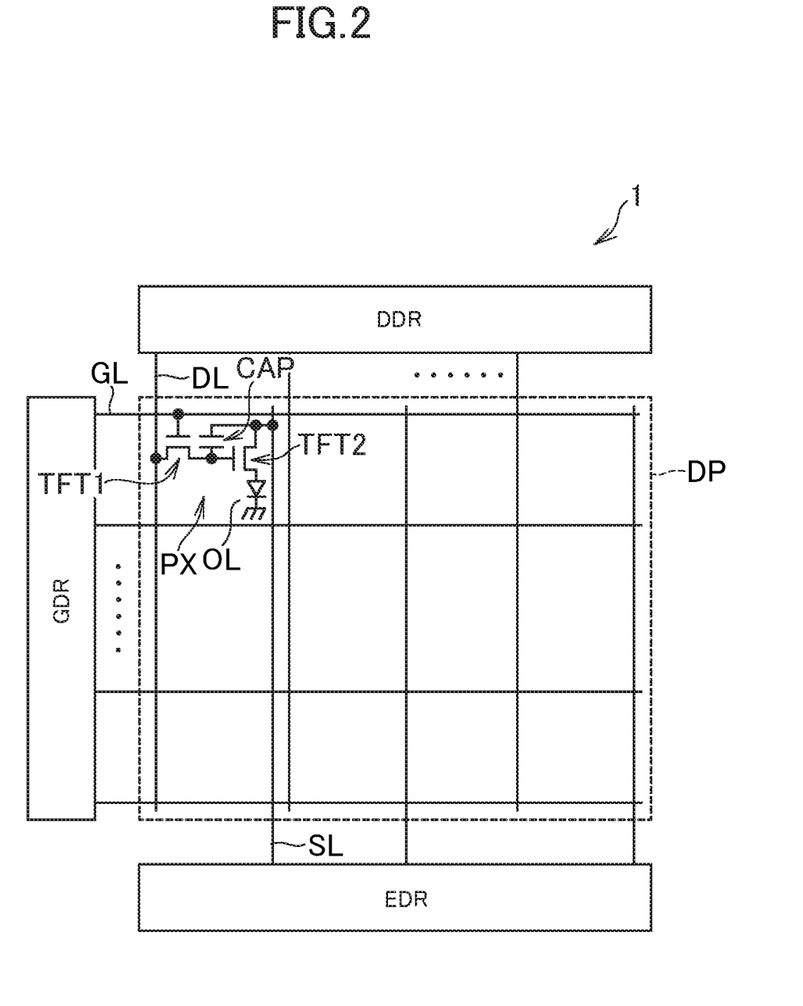
FIG. 2 is a schematic view showing the state of a pixel circuit of the organic EL display device in the first embodiment.

FIG. 2 is a diagram showing the state of a pixel circuit in a display area DP of the organic EL display device 1 of the first embodiment. The organic EL display device 1 includes the display area DP where an image is displayed, a scanning signal line drive portion GDR, a video signal line drive portion DDR, and a power source drive portion EDR.

In the display area DP, organic electroluminescence elements OL and pixel circuits PX are disposed in a matrix corresponding respectively to a plurality of pixels. The pixel circuit PX is configured of a thin film transistor TFT1, a capacitive element CAP, and a thin film transistor TFT2. The scanning signal line drive portion GDR, the video signal line drive portion DDR, and the power source drive portion EDR drive the pixel circuit PX to control light emission of the organic electroluminescence element OL.

The scanning signal line drive portion GDR is connected to scanning signal lines GL each provided for an array of pixels (pixel row) in the horizontal direction, and outputs a scanning signal to the scanning signal lines GL sequentially selected.

The video signal line drive portion DDR is connected to video signal lines DL each provided for an array of pixels (pixel column) in the vertical direction, and outputs, in synchronization with the selection of the scanning signal line GL by the scanning signal line drive portion GDR, a voltage in response to a video signal of the selected pixel row to each of the video signal lines DL. The voltage is written to a capacitor in the pixel circuit PX, and a current in response to the written voltage is supplied to the organic electroluminescence element OL.

The power source drive portion EDR is connected to drive power source lines SL each provided for the pixel column, and supplies a current to the organic electroluminescence element OL through a switching element in the pixel circuit PX.

A cathode of the organic electroluminescence element OL is connected to a ground potential, and the cathodes of the organic electroluminescence elements OL of all of the pixels are configured of a common electrode.

Figure 3:
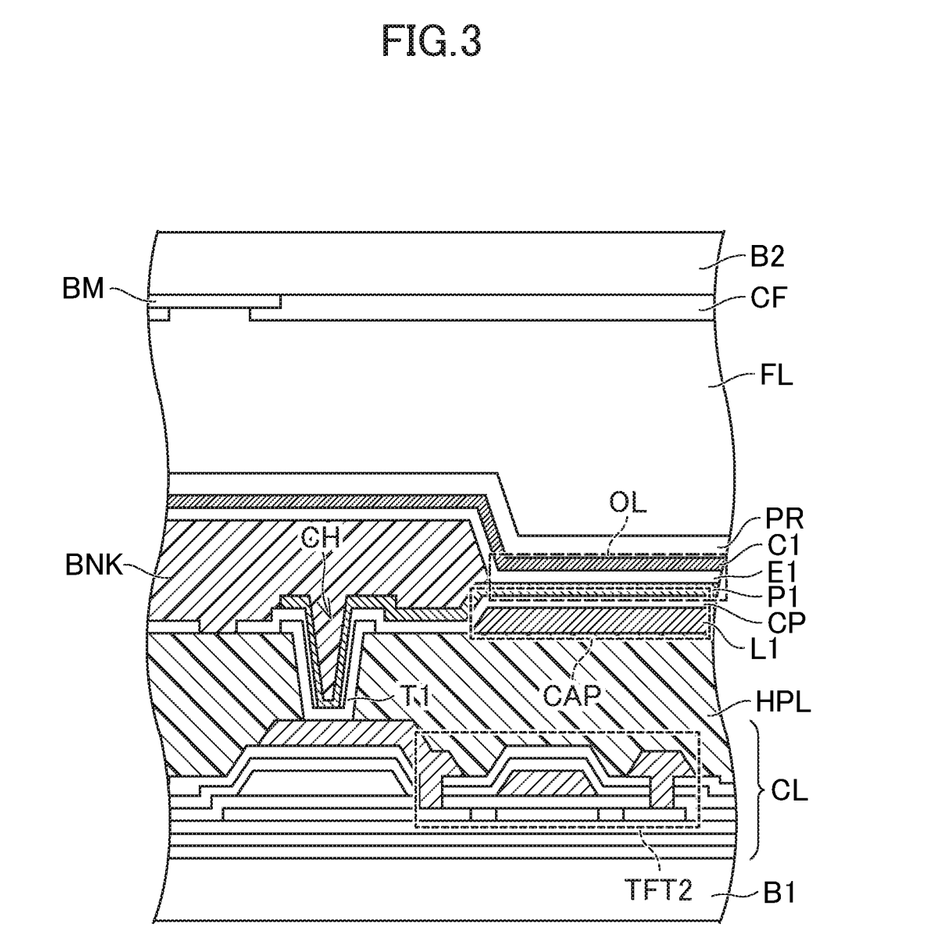
FIG. 3 is a cross-sectional view for explaining the state of a pixel of the organic EL display device in the first embodiment.

FIG. 3 is a diagram for explaining the state of a cross-section of a unit pixel in the organic EL display device 1 of the first embodiment. As shown in the drawing, the organic EL display device 1 is configured to include the first substrate B1 on which the plurality of organic electroluminescence elements OL are formed, the second substrate B2 which is disposed to face the first substrate B1 and on which a color filter layer CF and a black matrix BM are formed, and a filling layer FL filled between the first substrate B1 and the second substrate B2.

Moreover, the organic electroluminescence element OL is configured to include a pixel electrode P1, an organic layer E1, and a common electrode C1, in which the pixel electrode P1 and the organic layer E1 are in contact with each other and the organic layer E1 and the common electrode C1 are in contact with each other. A wiring layer L1 for forming the capacitive element CAP between the pixel electrode P1 and the wiring layer L1, and a capacitive insulating layer CP are disposed. The capacitive insulating layer CP is formed of an inorganic insulating film such as, for example, silicon nitride (SiNx). Moreover, a planarizing layer (resin layer) HPL formed of an organic insulating film such as acrylic resin or polyimide resin is formed for a base of the organic electroluminescence element OL, and the pixels (the organic electroluminescence elements OL) are separated from each other by a bank layer (resin layer) BNK formed of a similar organic insulating film.

The pixel electrode P1 (anode) of the organic electroluminescence element OL is formed of high-reflective metal such as aluminum, and extends to the bottom portion of a contact hole CH to be connected to a transparent conductive layer T1. The pixel electrode P1 is electrically continuous with a source electrode of the thin film transistor (TFT) formed below the planarizing layer HPL. The common electrode C1 is formed of a transparent conductive film such as indium tin oxide (ITO), and serves as one layer of solid-like electrode common to all of the pixels in the display area DP.

The organic layer E1 in the embodiment is formed between the common electrode C1 and the pixel electrode P1, and configured to include a hole transport layer, a light-emitting layer, and an electron transport layer. In the light-emitting layer in the organic layer E1, holes injected from the pixel electrode P1 and electrons injected from the common electrode C1 are recombined to emit light. All of the layers constituting the organic layer E1 may be formed over the entire display area DP, or may be formed individually for each of the pixel. The luminance of the light-emitting layer of the organic electroluminescence element OL is controlled by a current from a circuit layer CL. The circuit layer CL includes the thin film transistor TFT2 and the thin film transistor TFT1 (not shown).

Moreover, the organic electroluminescence elements OL of the pixels are covered and protected by a sealing layer PR. The sealing layer PR in the embodiment is configured of an inorganic insulating film, and specifically, configured to include a silicon nitride layer and a silicon oxide layer. The sealing layer PR may include, for example, a resin layer interposed partially between the silicon nitride layer and the silicon oxide layer, or an organic insulating film may be included in a portion of the sealing layer PR in some cases.

The planarizing layer HPL is formed of an organic insulating film to a relatively thick thickness, and absorbs steps produced on the circuit layer CL in which the thin film transistor TFT and the like are formed, and planarizes the circuit layer CL. As shown in the drawing, the circuit layer CL is configured to include the electrodes of the thin film transistor connected to the pixel electrode P1, other wirings, a gate insulating film, and an inter-layer insulating film, and includes circuits for controlling currents respectively corresponding to the pixels in the display area DP.

Figure 4:
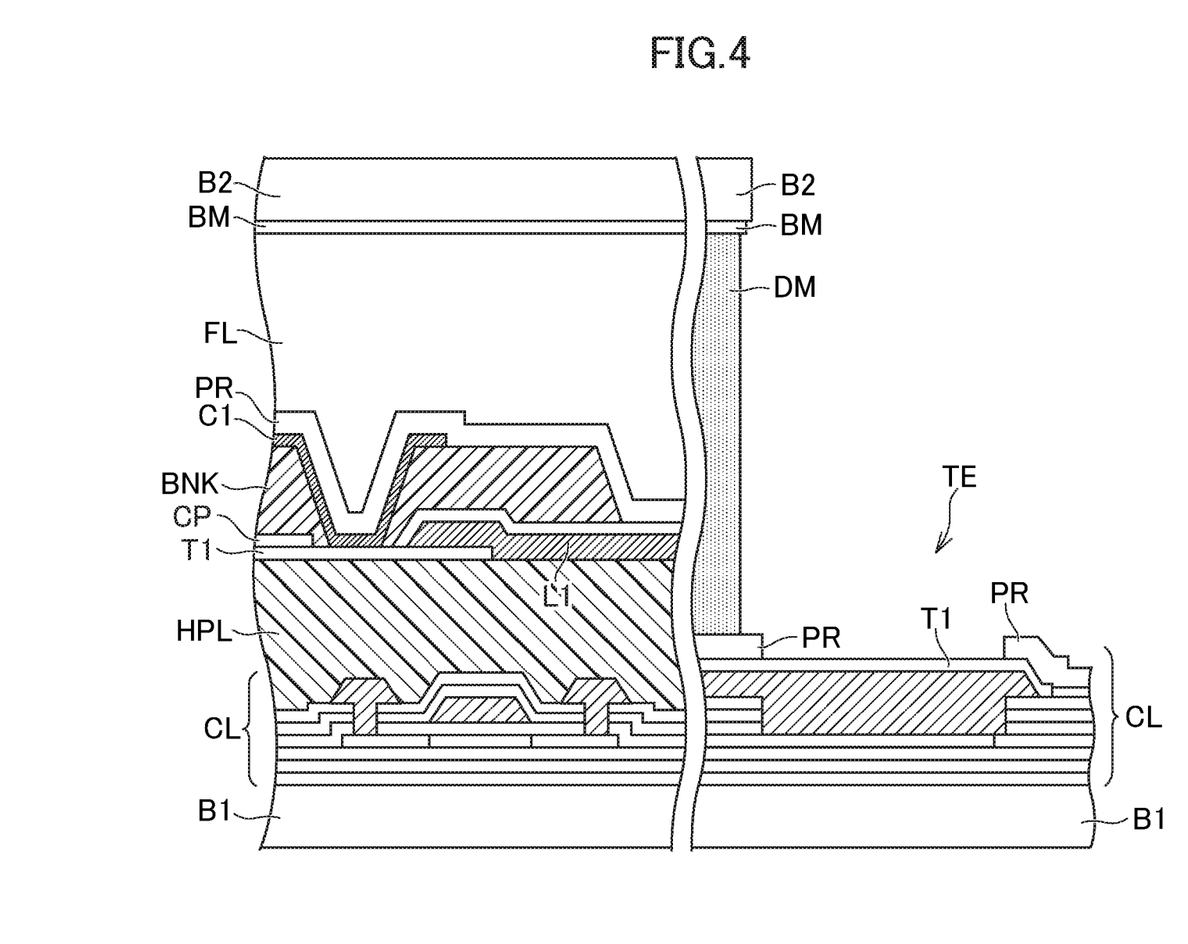
FIG. 4 is a cross-sectional view for explaining the state of a picture-frame area located around the periphery of a display area and the state of a terminal portion of the organic EL display device in the first embodiment.

FIG. 4 is a diagram showing the state of a picture-frame area located around the periphery of the display area DP and the state of a terminal portion TE formed in the exposed area EX of the organic EL display device 1 in the first embodiment. The left figure in FIG. 4 shows the state of the picture-frame area, while the right figure shows the state of the terminal portion TE. A sealing material DM that bonds the first substrate B1 and the second substrate B2 together is provided therebetween. The sealing material DM is disposed along the outline of the second substrate B2, and the filling layer FL is disposed inside the sealing material DM.

As shown in the left cross-sectional view in FIG. 4, the common electrode C1 is in contact with the transparent conductive film T1 exposed in the picture-frame area (outside the display area DP), and is supplied with a common potential through the wiring layer L1. As shown in the right cross-sectional view in FIG. 4, a metal layer in the same layer as the source/drain electrode of the thin film transistor is exposed in the terminal portion TE, and connected from the terminal portion TE to the driver semiconductor device IC.

Figure 5A:
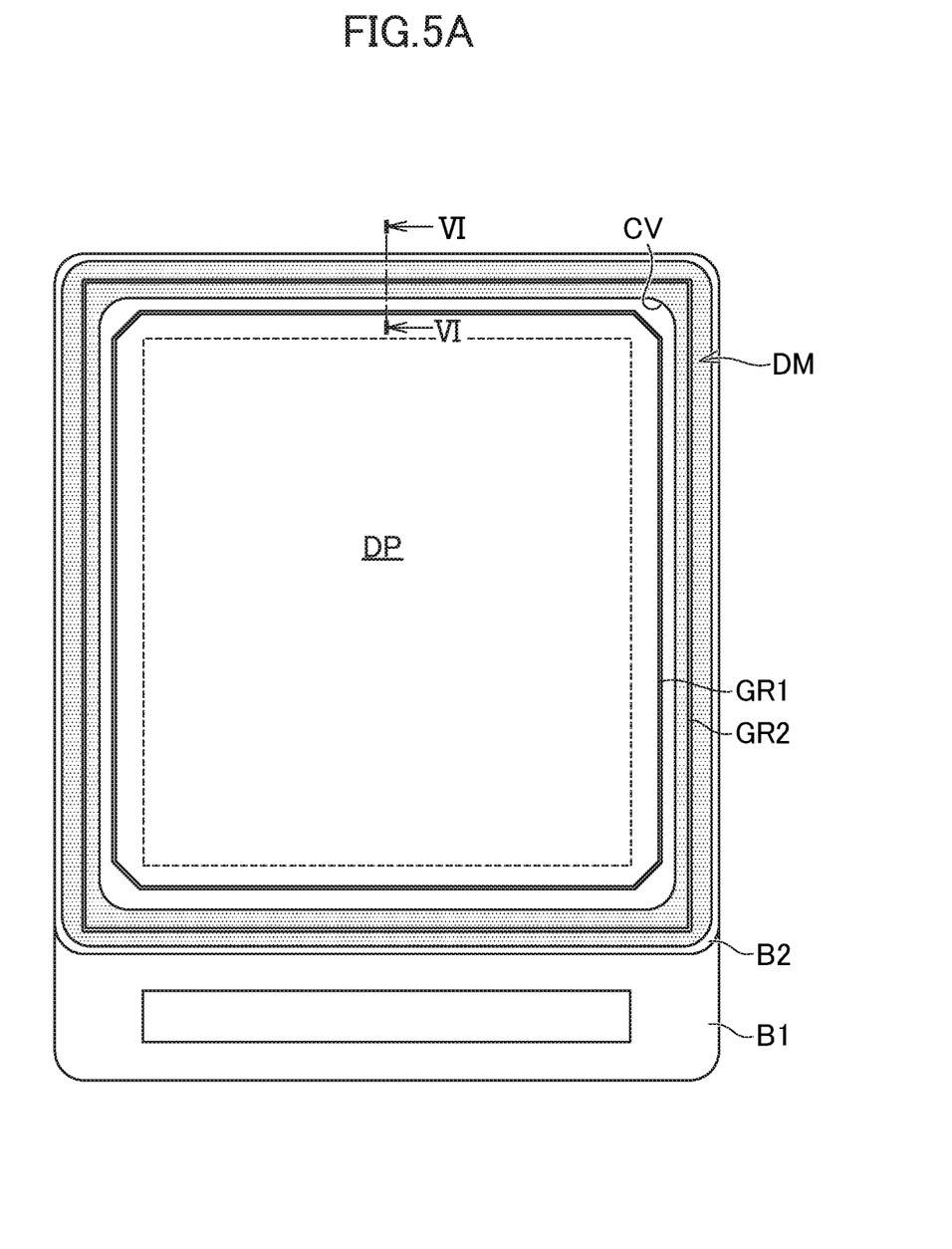
FIG. 5A is a plan view showing the state of the vicinity of corner portions of the display area in the first embodiment.
Figure 5B:
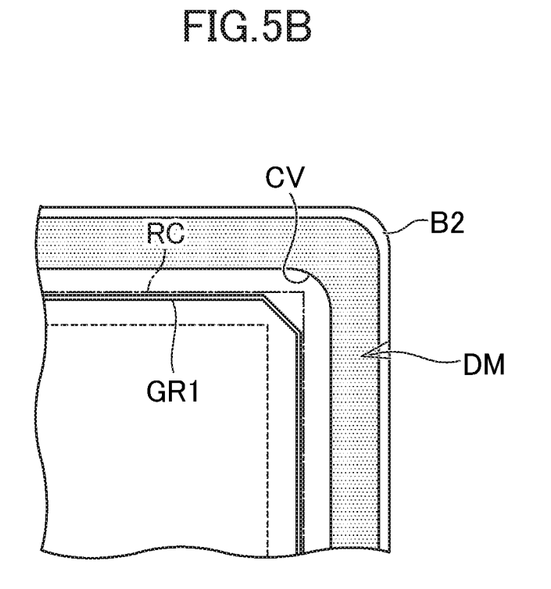
FIG. 5B is an enlarged plan view showing the state of the vicinity of one corner portion of the display area in the first embodiment.
Figure 5C:
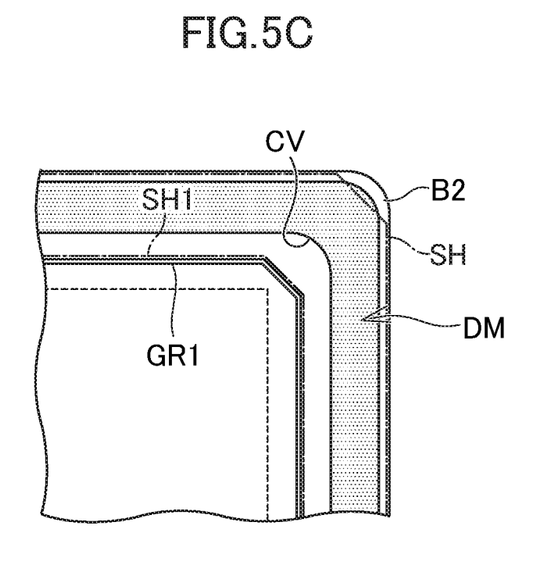
FIG. 5C is an enlarged plan view showing the state of the vicinity of one corner portion of the display area in the first embodiment.

Here, especially FIG. 5A shows a schematic view when the first substrate B1 of the organic EL display device 1 in the embodiment is viewed from above. As shown in the drawing, a groove GR1 (first groove) for blocking the entry of moisture from the planarizing layer HPL and the bank layer BNK both formed of an organic insulating film is disposed between the display area DP where an image is displayed and an area where the sealing material DM is disposed. FIGS. 5B and 5C are diagrams each showing an enlarged view of a corner portion at the upper right portion of the organic EL display device 1, in which representation of a groove GR2 (second groove) is omitted.

The sealing material DM has a rounded shape at the corner portions of the second substrate B2 bonded to the first substrate B1, and includes curved portions CV each of which is concave in a direction in which the corner portion of the display area DP projects. The groove GR1 is configured in such a shape to avoid overlapping with the sealing material DM because an entry path for moisture to the display area DP may be formed when the groove GR1 overlaps the sealing material DM. That is, as viewed planarly, the groove GR1 is formed, as shown in FIGS. 5A and 5B, so as to be inscribed in a rectangle RC surrounding the display area DP, and formed, at the portions of corners of the rectangle, along a line describing a shape that is not in contact with the corners.

From another point of view, as shown in FIG. 5C (representation of the groove GR2 is omitted in FIG. 5C), the groove GR1 is formed along a line describing a similar figure SH1 to a shape SH that is inscribed in the planar shape of the second substrate B2 and not in contact with the corner portions of the second substrate B2, and formed to be smaller than the shape SH.

Specifically, the groove GR1 in the embodiment extends in a straight line in an oblique direction inside the corners of the rectangle RC surrounding the display area DP to connect the groove GR1 that extends in the vertical direction with the groove GR1 that extends in the horizontal direction, and thus the groove GR1 depicts chamfered corners with the vertices of the rectangle of the display area DP removed.

Although, in FIG. 5A, the groove GR2 is also formed at a position overlapping the sealing material DM, the groove GR2 may not be necessarily present in terms of blocking moisture.

Figure 6:
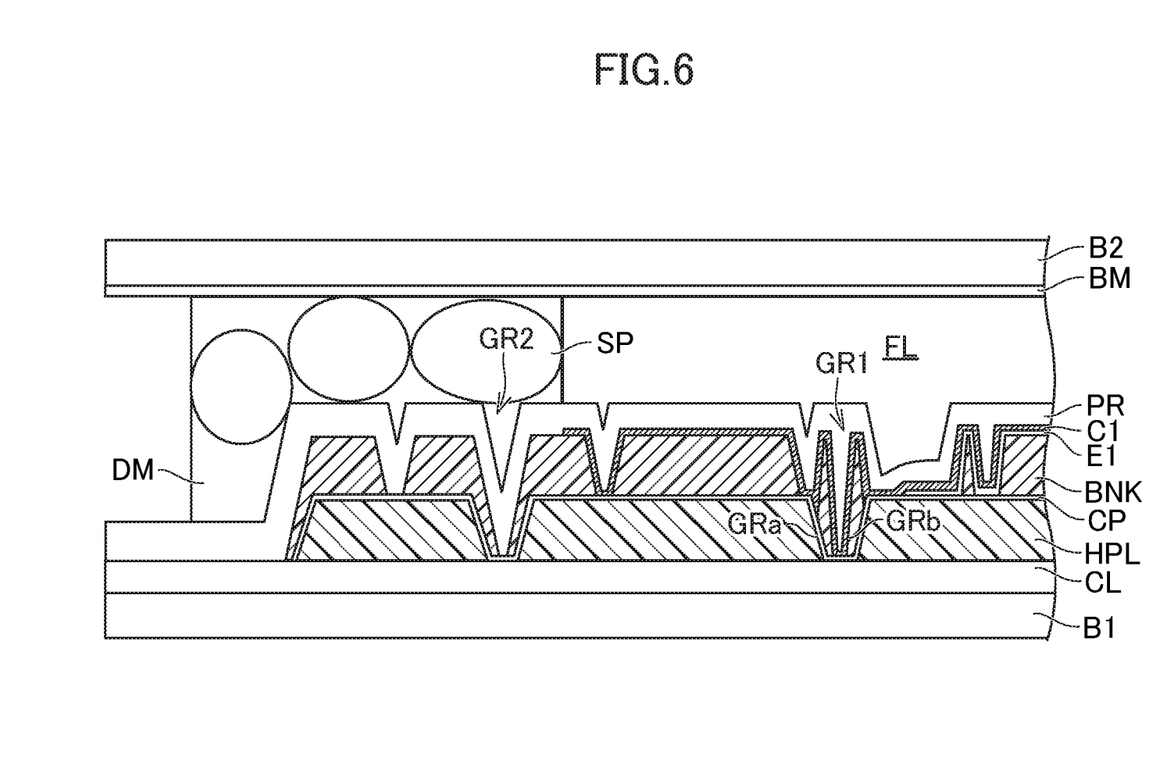
FIG. 6 is a diagram showing the state of a cross-section along VI-VI in FIG. 5A.

FIG. 6 is a diagram showing a cross-section along VI-VI in FIG. 5A. As shown in the drawing, the groove GR1 is formed by removing the planarizing layer HPL and the bank layer BNK by etching. As described above, the groove GR1 divides the resin layers into the resin layers on the display area DP side and the resin layers on the sealing material DM side.

As the groove GR1 in the embodiment, first, an outer tapered shape GRa is formed in the planarizing layer HPL that is located around the periphery of the display area DP and located in the picture-frame area. Further, the capacitive insulating layer CP is formed on the surface of the tapered shape GRa, so that the organic insulating film due to the planarizing layer HPL is divided by the inorganic insulating film. Next, the bank layer BNK is formed so as to be filled in the tapered shape GRa covered by the capacitive insulating layer CP, and thereafter, an inner tapered shape GRb is further formed. The common electrode C1 is formed on the surface of the inner tapered shape GRb, and further, the sealing layer PR is filled inside the tapered shape GRb.

Hence, in the groove GR1, the organic insulating films of the bank layer BNK and the planarizing layer HPL are divided by the sealing layer PR and the common electrode C1, and further, the organic insulating film of the planarizing layer HPL is divided by the capacitive insulating film CP. With the groove GR1 described above, a moisture path that may be formed in the bank layer BNK or the planarizing layer HPL is divided, so that moisture is prevented from reaching the organic layer E1 formed in the display area DP and thus the reliability of the organic EL display device 1 is improved.

In the embodiment as described above, the groove GR1 is configured of the outer tapered shape GRa and the inner tapered shape GRb in the planarizing layer HPL. However, it is sufficient that the groove GR1 penetrates the organic insulating films of the planarizing layer HPL and the like so as to reach the inorganic insulating film located on the uppermost surface of the circuit layer CL and in contact with the lower surface of the planarizing layer HPL and, further, the planarizing layer HPL on the display area DP side and the planarizing layer HPL on the outside thereof are divided with the inorganic insulating film that intervenes therebetween.

Moreover, the groove GR2 surrounds the groove GR1 from the outside, and is formed into a rectangular shape. However, since the groove GR2 is formed at the position overlapping the sealing material DM, there is a risk that the sealing layer PR and the like within the groove GR2 may be broken by spacer particles SP that are contained in the sealing material DM and define a gap between the first substrate B1 and the second substrate B2. For this reason, there is a possibility that an entry path for moisture is formed in the groove GR2, so that the groove GR2 alone cannot sufficiently prevent the entry of moisture into the display area DP.

Moreover, when the groove GR1 is formed angular without removing the vertices of the rectangular shape similarly to the planar shape of the groove GR2, there is a possibility that the rounded curved portion CV of the sealing material DM may overlap the groove GR1 at the position of the corner of the groove GR1 due to a slight shift in the disposition of the sealing material DM. As described above, when the overlapping of the sealing material DM and the groove GR1 occurs, there is the risk that the sealing layer PR may be broken by the spacer particles SP contained in the sealing material DM and thus the entry path for moisture may be produced. Therefore, by forming the groove GR1 with a rectangular planar shape with the vertices removed as in the embodiment, the entry of moisture can be prevented while reducing alignment accuracy for disposing the sealing material DM. Further, since there is no need to coat a coating pattern of the sealing material DM in an outward convex shape so as to avoid the corner portion of the groove GR1, the picture-frame area can be narrowed.

Figure 7:
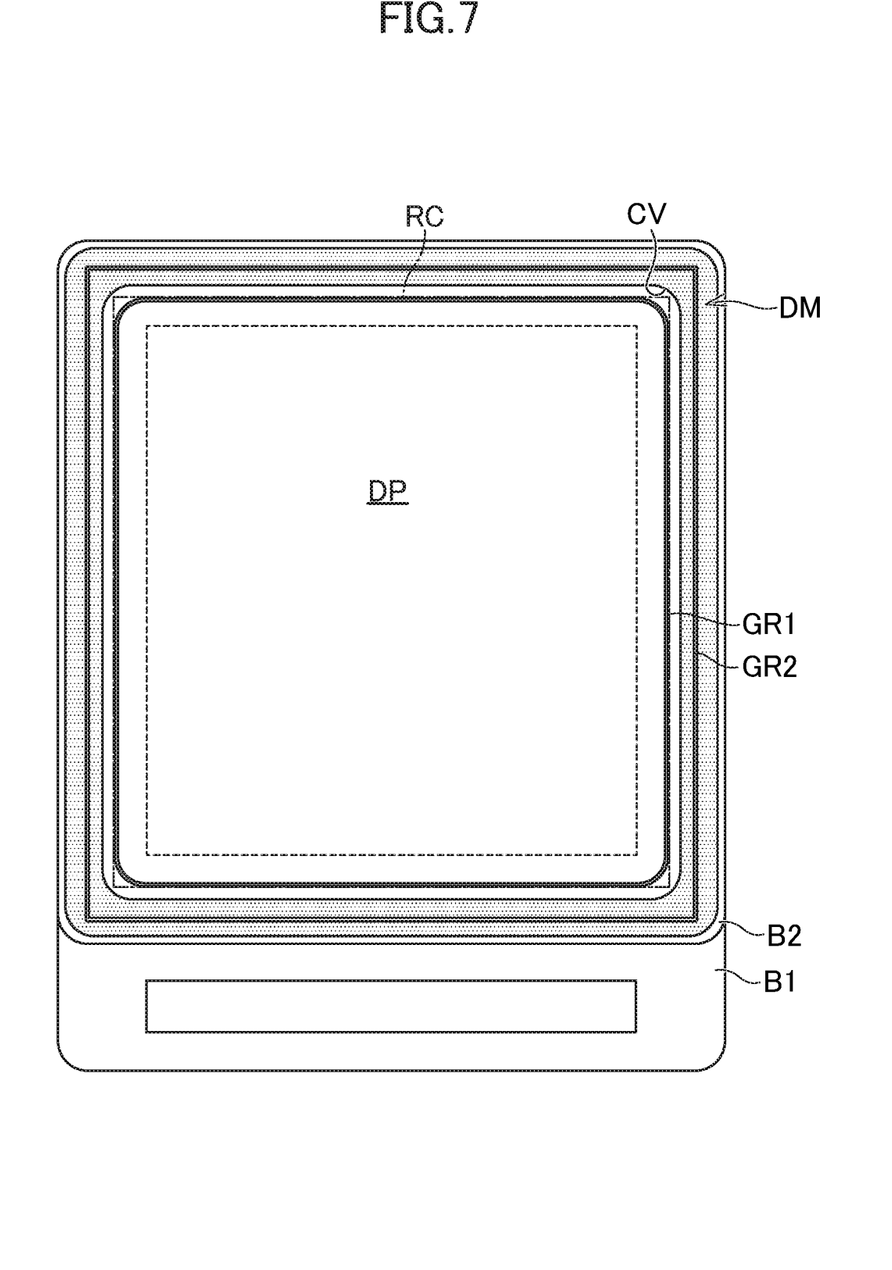
FIG. 7 is a diagram showing Modified Example 1 of the organic EL display device in the first embodiment.

Next, FIG. 7 is a diagram showing Modified Example 1 of the organic EL display device 1 of the first embodiment. As shown in the drawing, the planar shape of the groove GR1 is formed so as to be inscribed in the top, bottom, left, and right sides of the rectangle RC surrounding the display area DP, while extending, inside the corners of the rectangle RC, in a curved line that is convex in the projecting direction of the corners. Specifically, the groove GR1 of Modified Example 1 has a rounded shape inside the corners surrounding the display area DP. The curvature of the corner portion in the groove GR1 may be larger than the curvature of the corner portion of the sealing material DM.

By forming the corner portions in the groove GR1 into a rounded shape as described above, a stress is prevented from concentrating on the sealing layer PR and the like filled in the groove GR1, and thus the breakage of the sealing layer PR at the corner portion is prevented. The overlapping of the sealing material DM and the groove GR1 can also be prevented, and thus the breakage of the sealing layer PR at the corner portion is prevented.

Figure 8:
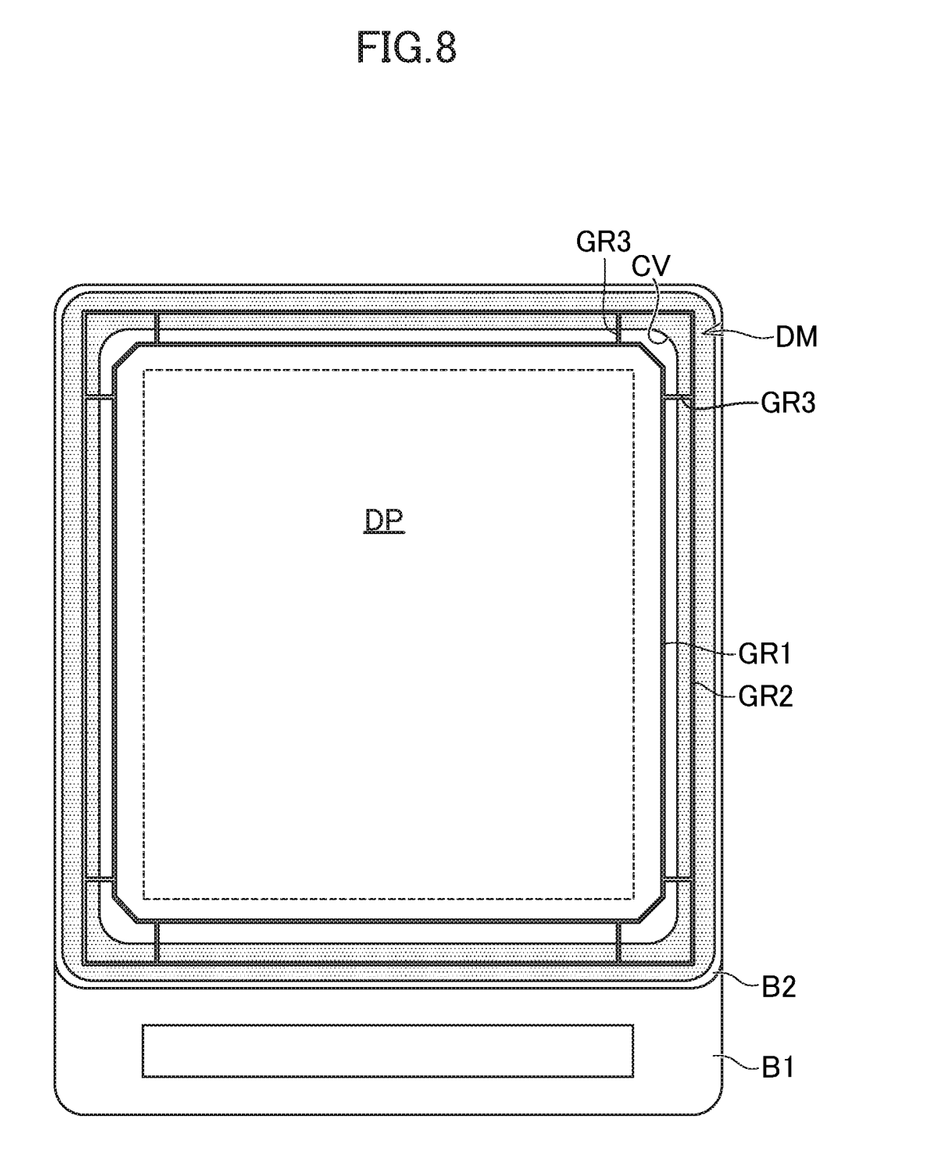
FIG. 8 is a diagram showing Modified Example 2 of the organic EL display device in the first embodiment.

FIG. 8 is a diagram showing Modified Example 2 of the organic EL display device 1 of the first embodiment. As shown in the drawing, grooves GR3 (third grooves) that couple the groove GR1 disposed inside the sealing material DM with the groove GR2 disposed overlapping the sealing material DM are formed in Modified Example 2. The grooves GR3 are formed while avoiding the corner portions of the groove GR2 and the like, so that even when moisture enters the corner portion of the groove GR1, the moisture is prevented from traveling to the sides connected to the corner portion of the groove GR1.

Although, in the embodiment described above, the inorganic insulating film or the metal layer other than the sealing layer PR is also formed inside the groove GR1, the inorganic insulating film or the like other than the sealing layer PR may not be included for example. Moreover, the sealing layer PR may be configured of a single layer of inorganic insulating layer, or may be configured of a plurality of different kinds of inorganic insulating layers.

The display device in the embodiment described above is the organic EL display device 1, but is not limited to an organic EL display device as long as it is a display device. The display device may be a display device including a light-emitting element such as a quantum-dot light-emitting diode (QLED) in each pixel.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
a first substrate;
a circuit layer which is arranged on the first substrate and includes pixel circuits arranged in a matrix;
a resin layer which is arranged on the circuit layer and has a first groove and a second groove;
organic light emitting elements on the resin layer, each of the organic light emitting elements being arranged in a matrix and being connected to corresponding one of the pixel circuits;
a bank on the resin layer;
a sealing layer on the organic light emitting elements; and
a layer including a filling material on the sealing layer, wherein
the organic light emitting elements include anodes on the resin layer, an organic layer including an organic emitting layer on the anodes, and a cathode on the organic layer,
the bank is arranged between the anodes and the organic layer and includes an organic insulation material,
each of the organic light emitting elements includes corresponding one of the anodes, corresponding one of regions of the organic layer, and corresponding one of regions of the cathode,
the organic light emitting elements share the organic layer and the cathode,
the bank covers a peripheral region of each of the anodes and exposes a part of an upper surface of each of the anodes,
the first groove has a first width,
the second groove has a second width and surrounds the pixel circuits and the organic light emitting elements in plan view, the first groove arranged between the pixel circuits and the second groove in the plan view,
the bank has a third groove directly above the first groove and a fourth groove directly above the second groove,
the third groove has a third width,
the fourth groove surrounds the pixel circuits and the organic light emitting elements in the plan view,
a first portion of the bank is arranged in the second groove, and
a side surface of the second groove is covered with the first portion.

2. The display device according to claim 1, further comprising:
a second substrate on the layer, wherein
the sealing layer includes a first inorganic layer, an organic insulation layer on the first inorganic layer, and a second inorganic layer on the organic insulation layer,
a first part of the sealing layer is arranged in the first groove,
a second part of the sealing layer is arranged in the second groove,
a third part of the sealing layer is arranged in the third groove, and
a fourth part of the sealing layer is arranged in the fourth groove.

3. The display device according to claim 1, wherein the fourth groove has a fourth width smaller than the second width of the second groove.

4. The display device according to claim 1, further comprising:
an inorganic layer between the resin layer and the bank, wherein
the inorganic layer is arranged between the first portion of the bank and the resin layer, and
the inorganic layer covers a bottom surface of the second groove and a side surface of the second groove.

5. The display device according to claim 1, wherein the first width of the first groove differs from the third width of the third groove.

6. The display device according to claim 2, wherein
a fifth part of the sealing layer is arranged directly above the third part of the sealing layer,
the fifth part of the sealing layer is arranged directly above the third groove,
a part of the layer is arranged directly above the fourth part of the sealing layer, and
the part of the layer is arranged in the fourth groove.

7. A display device comprising:
a first substrate;
a circuit layer which is arranged on the first substrate and includes pixel circuits arranged in a matrix;
a resin layer which is arranged on the circuit layer and has a first groove and a second groove;

organic light emitting elements on the resin layer, each of the organic light emitting elements being arranged in a matrix and being connected to corresponding one of pixel circuits;

a bank on the resin layer;

a sealing layer on the organic light emitting elements and the bank; and a layer including a filling material on the sealing layer, wherein the organic light emitting elements include: anodes on the resin layer; an organic layer including an organic emitting layer on the plurality of anodes; and a cathode on the organic layer, the bank is arranged between the anodes and the organic layer and includes an organic insulation material, each of the organic light emitting elements includes corresponding one of the anodes, corresponding region of the organic layer, and corresponding region of the cathode, the organic light emitting elements share the organic layer and the cathode, the bank covers a peripheral region of the each of the anodes and exposes a part of an upper surface of each of the anodes, the first groove has a first width, the second groove has a second width and surrounds the pixel circuits and the organic light emitting elements in plan view, the first groove arranged between the pixel circuits and the second groove in the plan view, the bank has a third groove directly above the first groove and a fourth groove directly above the second groove, the third groove has a third width, the fourth groove has a fourth width smaller than the second width of the second groove and surrounds the pixel circuits and the organic light emitting elements in the plan view.

8. The display device according to claim 7, further comprising:

a second substrate on the layer, wherein the sealing layer includes a first inorganic layer, an organic insulation layer on the first inorganic layer, and a second inorganic layer on the organic insulation layer, a first part of the sealing film is arranged in the first groove, a second part of the sealing film is arranged in the second groove, a third part of the sealing film is arranged in the third groove, and a fourth part of the sealing film is arranged in the fourth groove.

9. The display device according to claim 7, further comprising:

an inorganic layer between the resin layer and the bank, wherein the inorganic layer is arranged between the first portion of the bank and the resin layer, and the inorganic layer covers a bottom surface of the second groove and a side surface of the second groove.

10. The display device according to claim 7, wherein the first width of the first groove differs from the third width of the third groove.

11. The display device according to claim 8, wherein a fifth part of the sealing layer is arranged directly above the third part of the sealing layer, the fifth part of the sealing layer is arranged directly above the third groove, a part of the layer is arranged directly above the fourth part of the sealing layer, and the part of the layer is arranged in the fourth groove.

* * * * *